United States Patent
Kargl et al.

(10) Patent No.: US 8,625,727 B2
(45) Date of Patent: Jan. 7, 2014

(54) DEMODULATOR AND METHOD FOR DEMODULATING A CARRIER SIGNAL

(75) Inventors: Walter Kargl, Graz (AT); Edmund Ehrlich, Grambach (AT)

(73) Assignee: Infineon Technologies AG, Neubiberg (DE)

( * ) Notice: Subject to any disclaimer, the term of this patent is extended or adjusted under 35 U.S.C. 154(b) by 653 days.

(21) Appl. No.: 12/753,450

(22) Filed: Apr. 2, 2010

(65) Prior Publication Data

US 2011/0243200 A1    Oct. 6, 2011

(51) Int. Cl.
  *H04L 7/00*     (2006.01)
  *H04B 5/00*    (2006.01)

(52) U.S. Cl.
  USPC .......... 375/355; 375/219; 455/41.1; 340/10.1

(58) Field of Classification Search
  USPC ................. 375/219, 355, 360; 455/41.1, 280; 340/10.1
  See application file for complete search history.

(56) References Cited

U.S. PATENT DOCUMENTS

| | | | |
|---|---|---|---|
| 3,518,547 A | 6/1970 | Filipowsky | |
| 4,301,455 A | 11/1981 | Yetter | |
| 4,652,775 A | 3/1987 | Daudelin | |
| 5,937,013 A | 8/1999 | Lam et al. | |
| 6,407,629 B1 | 6/2002 | Burri et al. | |
| 6,535,553 B1 | 3/2003 | Limberg et al. | |
| 6,650,264 B1 | 11/2003 | Chan et al. | |
| 6,677,892 B1 | 1/2004 | Elleaume | |
| 6,961,370 B2 | 11/2005 | Chappell | |
| 7,480,348 B2 | 1/2009 | Nakano | |
| 2004/0203478 A1* | 10/2004 | Scott | ............... 455/70 |
| 2005/0096881 A1 | 5/2005 | Watson et al. | |
| 2006/0160515 A1* | 7/2006 | Wong | ............. 455/280 |
| 2006/0274857 A1 | 12/2006 | Chiu | |
| 2006/0274862 A1 | 12/2006 | Lui et al. | |
| 2006/0274874 A1 | 12/2006 | Kumar et al. | |
| 2007/0118312 A1 | 5/2007 | Cech et al. | |
| 2007/0140382 A1 | 6/2007 | Qian | |
| 2007/0233407 A2 | 10/2007 | Cech et al. | |
| 2007/0291884 A1* | 12/2007 | Frederick et al. | ............. 375/350 |
| 2008/0240319 A1 | 10/2008 | Ran | |
| 2009/0028279 A1 | 1/2009 | Kitta | |
| 2009/0103654 A1 | 4/2009 | van Waasen et al. | |
| 2010/0167644 A1* | 7/2010 | Winter et al. | ................ 455/41.1 |

FOREIGN PATENT DOCUMENTS

| | | |
|---|---|---|
| DE | 69930745 T2 | 9/2006 |
| EP | 0289237 A2 | 11/1988 |
| EP | 1482672 A1 | 12/2004 |

(Continued)

*Primary Examiner* — Shuwang Liu
*Assistant Examiner* — David Huang
(74) *Attorney, Agent, or Firm* — Murphy, Bilak & Homiller, PLLC

(57) ABSTRACT

A demodulator includes a sampler and a trigger unit. The sampler is configured to sample a carrier signal based on a trigger signal to obtain a demodulated signal. The trigger unit is configured to detect a zero crossing of the carrier signal or an extreme value of an amplitude of the carrier signal. Further, the trigger unit is configured to provide the trigger signal based on the detected zero crossing or the detected extreme value, so that the carrier signal is sampled by the sampler with a predefined phase shift to the detected zero crossing or the detected extreme value. The predefined phase shift is larger than 30° plus an integer multiple of 90° and lower than 60° plus the same integer multiple of 90° in reference to the carrier signal.

32 Claims, 9 Drawing Sheets

(56) References Cited

FOREIGN PATENT DOCUMENTS

| | | | |
|---|---|---|---|
| GB | 2100538 A | 12/1982 | |
| WO | 03/049275 A1 | 6/2003 | |
| WO | 2006/105565 A1 | 10/2006 | |
| WO | 2007/001863 A2 | 1/2007 | |
| WO | 2008093254 A1 | 8/2008 | |

* cited by examiner

DEMODULATOR AND METHOD FOR DEMODULATING A CARRIER SIGNAL

BACKGROUND

To communicate with other devices in a wireless communication system, many wireless devices include demodulators. These demodulators are, for example, included in chip sets that enable wireless communication via one of several communication standards, such as Bluetooth, digital enhanced cordless telecommunication (DECT), radio frequency identification (RFID) communication or others. Since these chip sets are commonly used in cell phones, music players, proximity coupling devices (PCD) or proximity integrated circuit cards (PICC), it is desirable for the chip sets to be relatively compact and efficient, thereby providing low cost and high data rates.

SUMMARY OF THE INVENTION

According to an embodiment of a demodulator, the demodulator includes a sampler and a trigger unit. The sampler is configured to sample a carrier signal based on a trigger signal to obtain a demodulated signal. The trigger unit is configured to detect a predefined amplitude value of the carrier signal and provide the trigger signal based on the detected predefined amplitude value, so that the carrier signal is sampled by the sampler with a predefined phase shift. The predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal.

According to an embodiment of a transceiver, the transceiver includes a sampler, a trigger unit and an oscillation unit. The sampler is configured to sample a carrier signal based on a trigger signal to obtain a demodulated signal. The trigger unit is configured to detect a predefined amplitude value of the carrier signal and provide the trigger signal based on the detected predefined amplitude value, so that the carrier signal is sampled by the sampler with a predefined phase shift. The predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal. The oscillator unit is configured to provide an oscillator signal comprising a carrier frequency. The transceiver is configured to transmit a signal with the carrier frequency based on the oscillator signal and receive the carrier signal in a modulated state or an unmodulated state.

According to another embodiment of a demodulator, the demodulator includes an analog-digital-converter and a trigger unit. The analog-digital-converter is configured to sample a carrier signal in a modulated state based on a trigger signal to obtain a demodulated, digital signal. The trigger unit is configured to detect a zero crossing of the carrier signal in an unmodulated state and provide the trigger signal based on the detected zero crossing, so that the carrier signal is sampled by the analog-digital-converter with a predefined phase shift of 45° plus an integer multiple of 90° relative to the detected zero crossing in reference to the carrier signal with a tolerance of 5°.

According to yet another embodiment of a demodulator, the demodulator includes means for sampling a carrier signal based on a trigger signal to obtain a demodulated signal and means for detecting a zero crossing of the carrier signal or an extreme value of an amplitude of the carrier signal. The demodulator further includes means for providing the trigger signal based on the detected zero crossing or the detected extreme value, so that the carrier signal is sampled by the means for sampling with a predefined phase shift to the detected zero crossing or the detected extreme value, wherein the predefined phase shift is larger than 30° plus and integer multiple of 90° and lower than 60° plus the same integer multiple of 90° in reference to the carrier signal.

According to an embodiment of a method for demodulating a carrier signal, the method includes detecting a predefined amplitude value of the carrier signal, providing a trigger signal based on the detected predefined amplitude value and sampling the carrier signal based on the trigger signal to obtain a demodulated signal. The trigger signal is provided so that the carrier signal is sampled with a predefined phase shift. The predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal.

According to another embodiment of a method for demodulating a carrier signal, the method includes detecting a zero crossing of the carrier signal in an unmodulated state, providing a trigger signal based on the detected zero crossing and sampling the carrier signal in a modulated state based on the trigger signal to obtain a demodulated, digital signal. The trigger signal is provided so that the carrier signal is sampled with a phase shift of 45° plus an integer multiple of 90° relative to the detected zero crossing in reference to the carrier signal with a tolerance of 5°.

According to an embodiment of a computer program product, the computer program product comprises a computer readable medium storing program code for performing a method of demodulating a carrier signal, when the computer program product runs on a computer or a microcontroller. The method includes detecting a predefined amplitude value of the carrier signal, providing a trigger signal based on the detected predefined amplitude value and sampling the carrier signal based on the trigger signal to obtain a demodulated signal. The trigger signal is provided so that the carrier signal is sampled with a predefined phase shift. The predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal.

According to another embodiment of a computer program product, the computer program product comprises a computer readable medium storing program code for performing a method of demodulating a carrier signal, when the computer program product runs on a computer or a microcontroller. The method includes detecting a zero crossing of the carrier signal in an unmodulated state, providing a trigger signal based on the detected zero crossing and sampling the carrier signal in a modulated state based on the trigger signal to obtain a demodulated, digital signal. The trigger signal is provided so that the carrier signal is sampled with a phase shift of 45° plus an integer multiple of 90° relative to the detected zero crossing in reference to the carrier signal with a tolerance of 5°.

Those skilled in the art will recognize additional features and advantages upon reading the following detailed description, and upon viewing the accompanying drawings.

BRIEF DESCRIPTION OF THE DRAWINGS

Embodiments according to the invention will be explained in greater detail in the following with reference to the accompanying Figures, in which.

DETAILED DESCRIPTION

Figure 1:
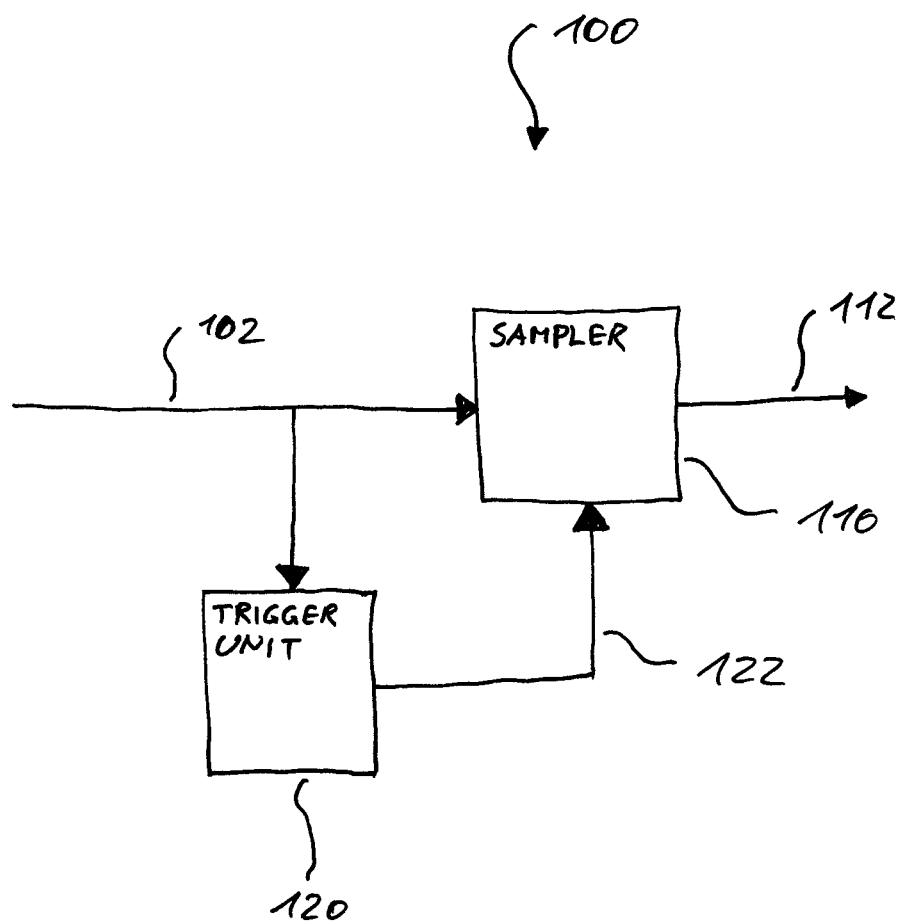
FIG. 1 is a block diagram of an embodiment of a demodulator.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of a demodulator 100 according to an embodiment of the invention. The demodulator 100 comprises a sampler 110 and a trigger unit 120. The trigger unit 120 is connected to the sampler 110. The sampler 110 samples a carrier signal 102 based on a trigger signal 122 provided by the trigger unit 120 to obtain a demodulated signal 112. The trigger unit 120 detects a zero crossing of the carrier signal 102 or an extreme value of an amplitude of the carrier signal 102. Further, the trigger unit 120 provides the trigger signal 122 based on the detected zero crossing or the detected extreme value, so that the carrier signal 102 is sampled by the sampler 110 with a predefined phase shift in relation to the detected zero crossing or the detected extreme value. In some embodiments the predefined phase shift is larger than 30° plus an integer multiple of 90° and lower than 60° plus the same integer multiple of 90° in reference to the carrier signal 102.

By sampling the carrier signal 102 with a predefined phase shift of 30° to 60° (plus an integer multiple of 90°) from a detected zero crossing or a detected extreme value of the carrier signal, it may be guaranteed that the demodulated signal 112 may be obtained with a sufficient signal quality. Therefore, it may be sufficient to generate only one demodulated signal from the carrier signal 102 instead of an inphase signal and a quadrature phase signal. In this way, the hardware complexity and/or the costs of the demodulator may be significantly reduced compared with known demodulators. Further, no analog mixer and/or filter may be necessary for demodulating the carrier signal.

A phase shift in reference to the carrier signal 102 means that the phase shift relates to a period of the carrier signal. For example, for a carrier signal with a period length of 12 ns, the sampling of the carrier signal 102 may be delayed by 1-2 nanoseconds, which corresponds to a 30° to 60° phase shift.

Figure 2:
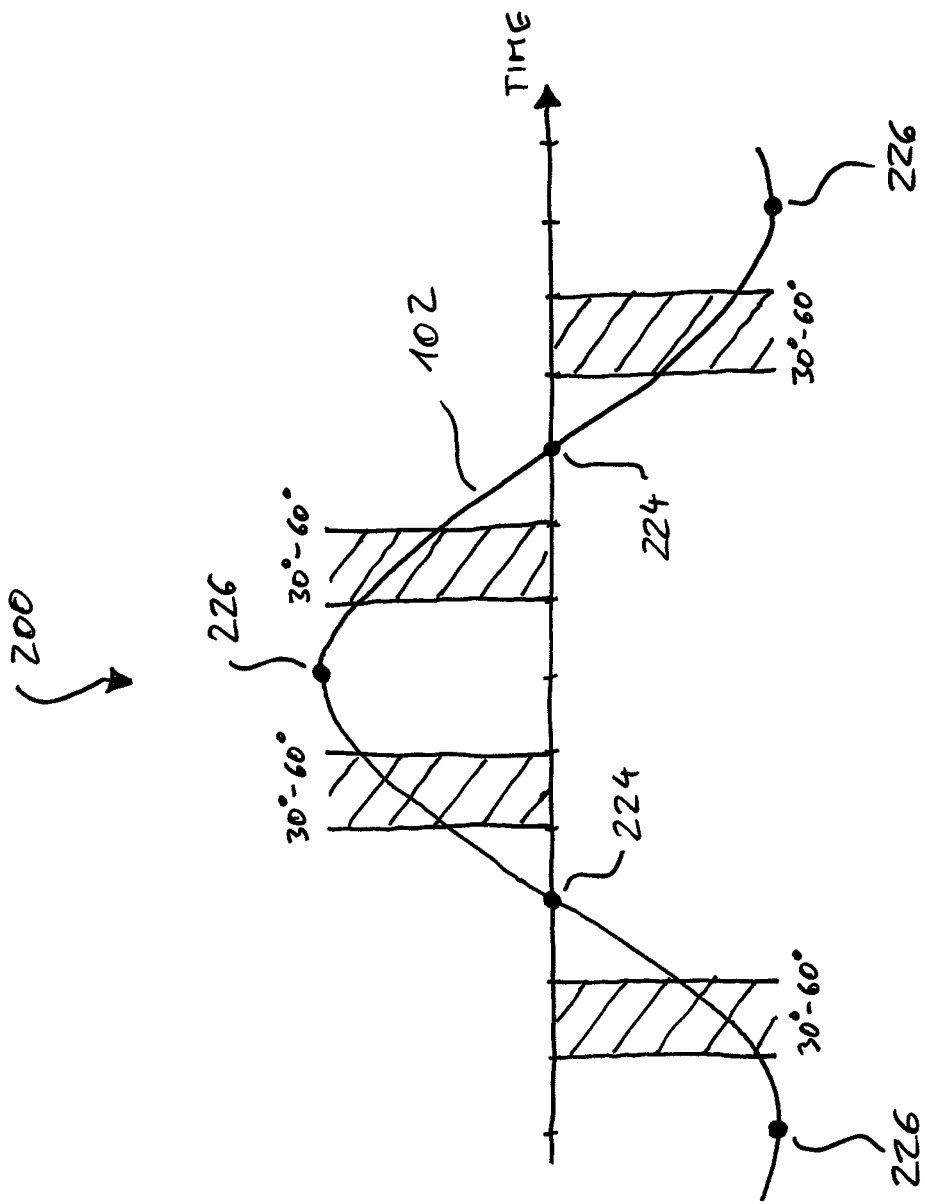
FIG. 2 is a schematic illustration of a carrier signal.

For illustrating possible detected zero crossings or extreme values as well as the region the carrier signal 102 is sampled due to the predefined phase shift, FIG. 2 shows a schematic illustration 200 of the carrier signal 102. For detecting zero crossings 224 and/or extreme values 226 (minimum and/or maximum) and possibly occurring DC portion (direct current) of the carrier signal 102 may be filtered out before the carrier signal 102 is provided to the trigger unit 120 or filtered out by the trigger unit 120 itself. The illustration shows two possible detected zero crossings 224 and three possible detected extreme values 226 (two minimum and one maximum). Due to the predefined phase shift of 30°+/−n*90° to 60°+/−n*90° (e.g., +210° to +240°, +120° to +150°, +30° to +60° or −30° to −60°, −120° to −150° or −210° to −240), the carrier signal 102 is sampled by the sampler 120 between a zero crossing and an extreme value at a position with sufficient signal strength. In contrast to the concept of sampling the carrier signal at its extreme values, the proposed concept is, for example, able to obtain a demodulated signal 112 comprising inphase and quadrature phase portions with sufficient signal quality simultaneously.

For example, the predefined phase shift may be equal to 45° (plus n*90°) in reference to the carrier signal 102 with a tolerance of +/−5° (or +/−10° or +/−1°).

With a 45° phase shift (plus an integer multiple of 90°) an inphase portion and a quadrature phase portion of the signal modulated onto the carrier signal 102 may be received with an equally good or equally bad signal quality, but it may be possible to use both of them. Depending on the application, only one or both signal portions (inphase signal and quadrature phase signal) may be necessary to obtain the transmitted information.

The sampler 110 may sample the carrier signal 102 with a sampling frequency equal to a frequency of the carrier signal 102 (in an unmodulated state) with a tolerance of 10% (or 20%, 5% or 1%) of the frequency of the carrier signal 102. In other words, it may be sufficient to detect one zero crossing or one extreme value by the trigger unit 120 to trigger the sampler 110 according to the predefined phase shift and afterwards, the sampler 110 may sample the carrier signal 102 periodically with the frequency of the carrier signal 102. Alternatively, the trigger unit 120 may detect zero crossings or extreme values periodically and trigger the sampler 110 accordingly. For this, the trigger unit 120 may detect zero crossings only at rising edges or only at falling edges or may detect only maxima or only minima of the carrier signal 102. In this way, the carrier signal 102 may be sampled by the sampler 110 periodically one time per period of the carrier signal 102 with the predefined phase shift.

The frequency of the carrier signal may be known by the demodulator. For example, the demodulator may be part of an RFID reader. In this example, the RFID reader may transmit an unmodulated or modulated carrier signal to a RFID device, also called RFID tag, and the RFID device may modulate data to be transmitted to the RFID reader onto the carrier signal.

The sampler 110 and the trigger unit 120 may be, for example, independent hardware units or part of a signal processor or microcontroller.

In some embodiments of the invention, the carrier signal 102 is modulated (amplitude and/or phase modulated), if data is transmitted by a transmitter using the carrier signal 102, and unmodulated, if no data is transmitted by a transmitter using the carrier signal 102. Therefore, the carrier signal 102 may comprise a modulated state or an unmodulated state. For such an application, the trigger unit 120 may be able to detect an unmodulated state of the carrier signal 102 and may detect the zero crossing of the carrier signal 102 or the extreme value of the amplitude of the carrier signal 102 based on the unmodulated carrier signal 102. According to this detected zero crossing or extreme value, the trigger unit 120 triggers the sampler 110 by the trigger signal 122 with the predefined phase shift. In the modulated state, the carrier signal 102 may be sampled by the sampler 110 periodically without continuously repeated synchronization to further zero crossings or extreme values. In other words, a detection of a zero crossing or an extreme value and a corresponding triggering of the sampler 110 may not be done, if the carrier signal 102 is in a modulated state.

Figure 3:
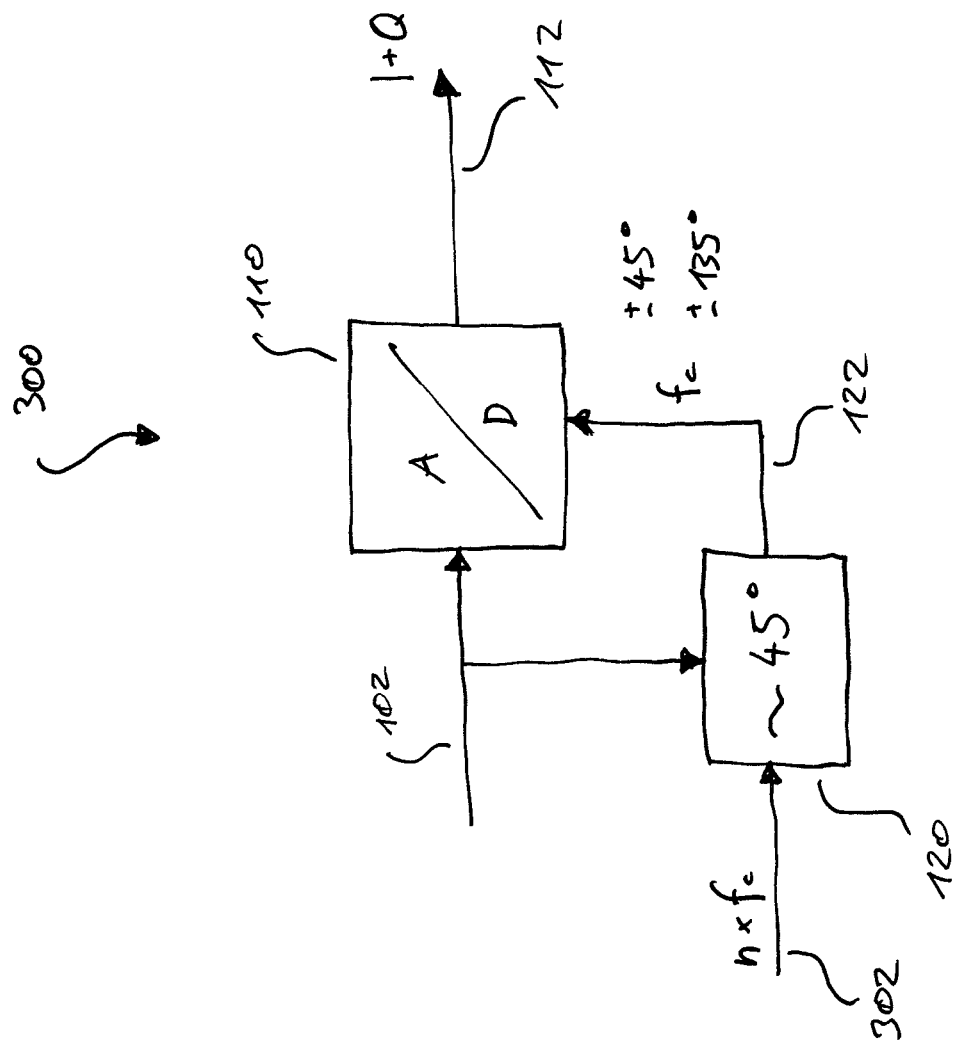
FIG. 3 is a block diagram of another embodiment of a demodulator.

In some embodiments according to the invention, the sampler 110 may comprise an analog-digital-converter (ADC). The ADC may sample the carrier signal 102 based on the trigger signal 122 to obtain a demodulated, digital signal 112. For example, FIG. 3 shows a block diagram of an embodiment of a demodulator 300 using a sampler 110 with an ADC. Further, FIG. 3 indicates that the trigger unit 120 triggers the ADC 110 with a predefined phase shift of about 45° (+/−a tolerance of 0.1°, 1°, 5° or 10°). This may be done based on a clock signal 302 with a frequency of n times the frequency of an internal clock or the frequency of the carrier signal $n \times f_c$. The ADC 110 may then be triggered by a trigger signal 122 with a frequency equal to the carrier frequency or to the frequency of the internal clock (oscillator) with a phase shift of +/−45° or +/−135° (considering tolerances mentioned above). The ADC 110 may generate a demodulated, digital signal 112 comprising portions of an inphase signal I and a quadrature signal Q contained by the carrier signal 102.

The ADC of the sampler 110 may be the only ADC of the demodulator 300 for sampling the carrier signal 102, because it may be sufficient to obtain one demodulated signal 112 from the carrier signal 102 according to the described concept.

The trigger unit 120 may be implemented in various ways. FIGS. 4a to 4d show block diagrams of possible implementations of trigger units 120 according to embodiments of the invention.

It may be sufficient to use a predefined phase shift (PPS) between 30° and 60°, but an additional shift of an integer multiple of 90° may have the same technical effect. Therefore, the predefined phase shift may be, for example, +/−30° to 60°, +/−120° to 150° or +/−210° to 240° and so on. The integer multiple may be a positive integer, a negative integer or 0. For example, 30°+/−n·90°<PPS<60°+/−n·90°.

Figure 4:
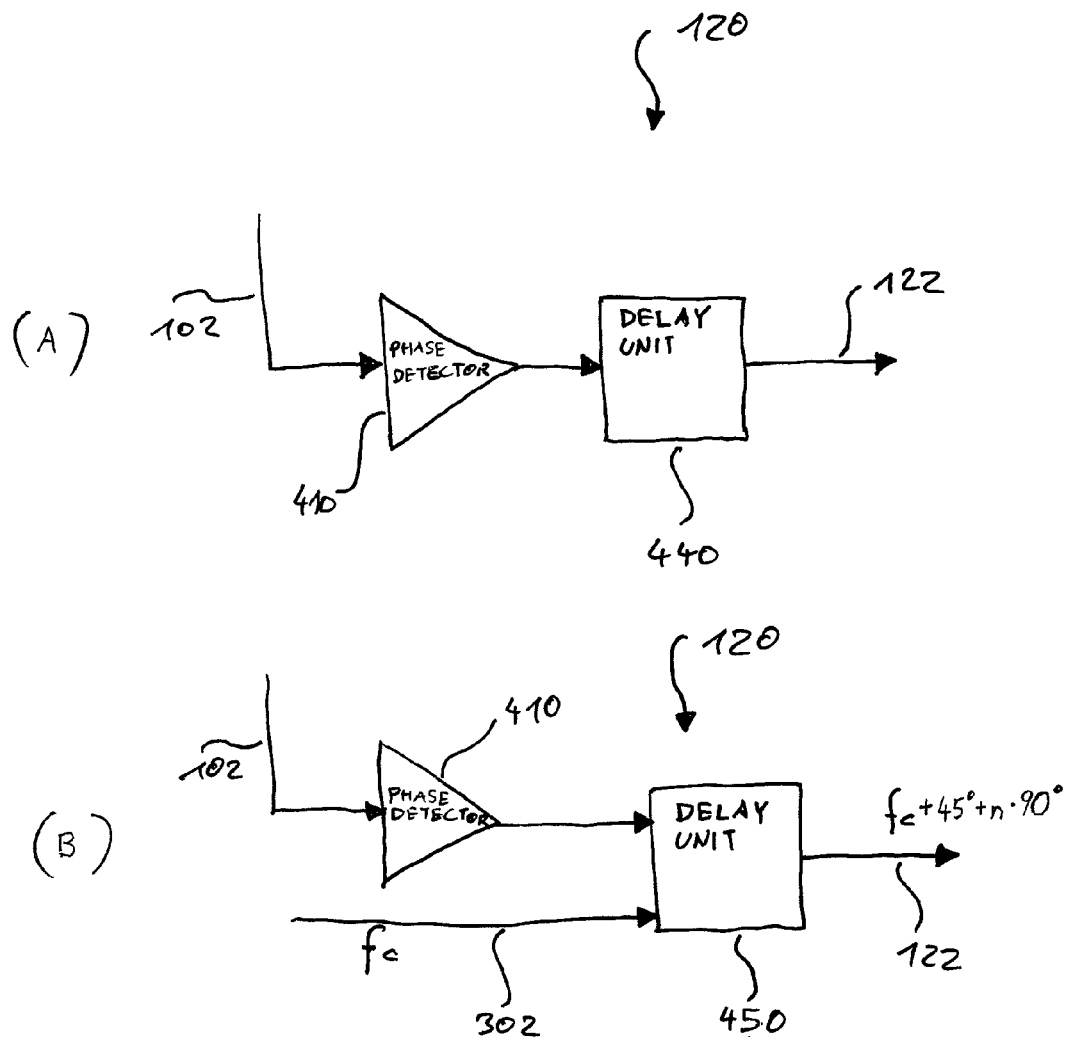
FIGS. 4a-4d are block diagrams of embodiments of trigger units.
Figure 4:
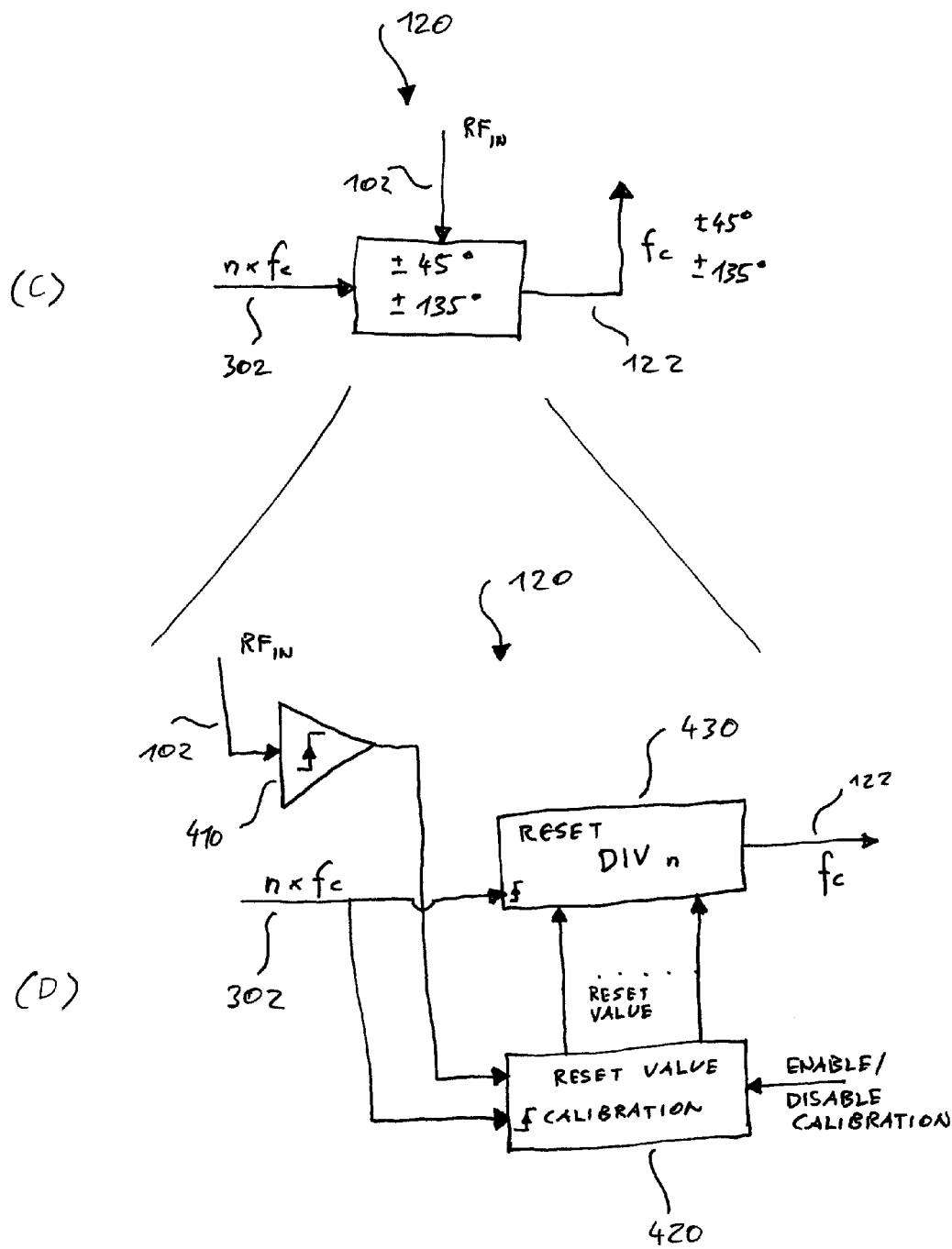

FIG. 4a shows an example of a trigger unit 120 comprising a phase detector 410 and a delay unit 440. The phase detector 410 may detect a zero crossing or an extreme value of the amplitude of the carrier signal 102 and may provide the trigger signal 122 with a trigger pulse at the time the zero crossing or the extreme value is detected. The delay unit 440 may delay the trigger signal 122 according to the predefined phase shift, so that the sampler is triggered to sample the carrier signal by the delayed trigger pulse with the predefined phase shift. For example, the phase detector 410 may detect every zero crossing of a rising edge of the carrier signal 102 and provides a trigger pulse for each detected zero crossing. Alternatively, each maximum, each minimum or each zero crossing of a falling edge may be detected by the phase detector 410. The delay unit 440 may be realized, for example, by delay buffers.

FIG. 4b shows an alternative implementation of the trigger unit 120. Again, the trigger unit 120 comprises a phase detector 410 and a delay unit 450. The phase detector 410 detects the zero crossing or the extreme value and provides a trigger pulse to the delay unit 450 at the time the zero crossing or the extreme value is detected. The delay unit 450 delays a clock signal $f_c$ 302 based on the trigger pulse provided by the phase detector 410 according to the predefined phase shift to obtain the trigger signal 122 (e.g., $f_c$+45°+n·90°) for the sampler, so that the sampler samples the carrier signal with the predefined phase shift.

The clock signal 302 may comprise the same frequency as the carrier signal 102 with a tolerance of 1% (or 0.1%, 5% or 10%) of the clock signal 302, so that the sampler is triggered by the trigger signal 122 periodically to sample the carrier signal.

Figure 5:
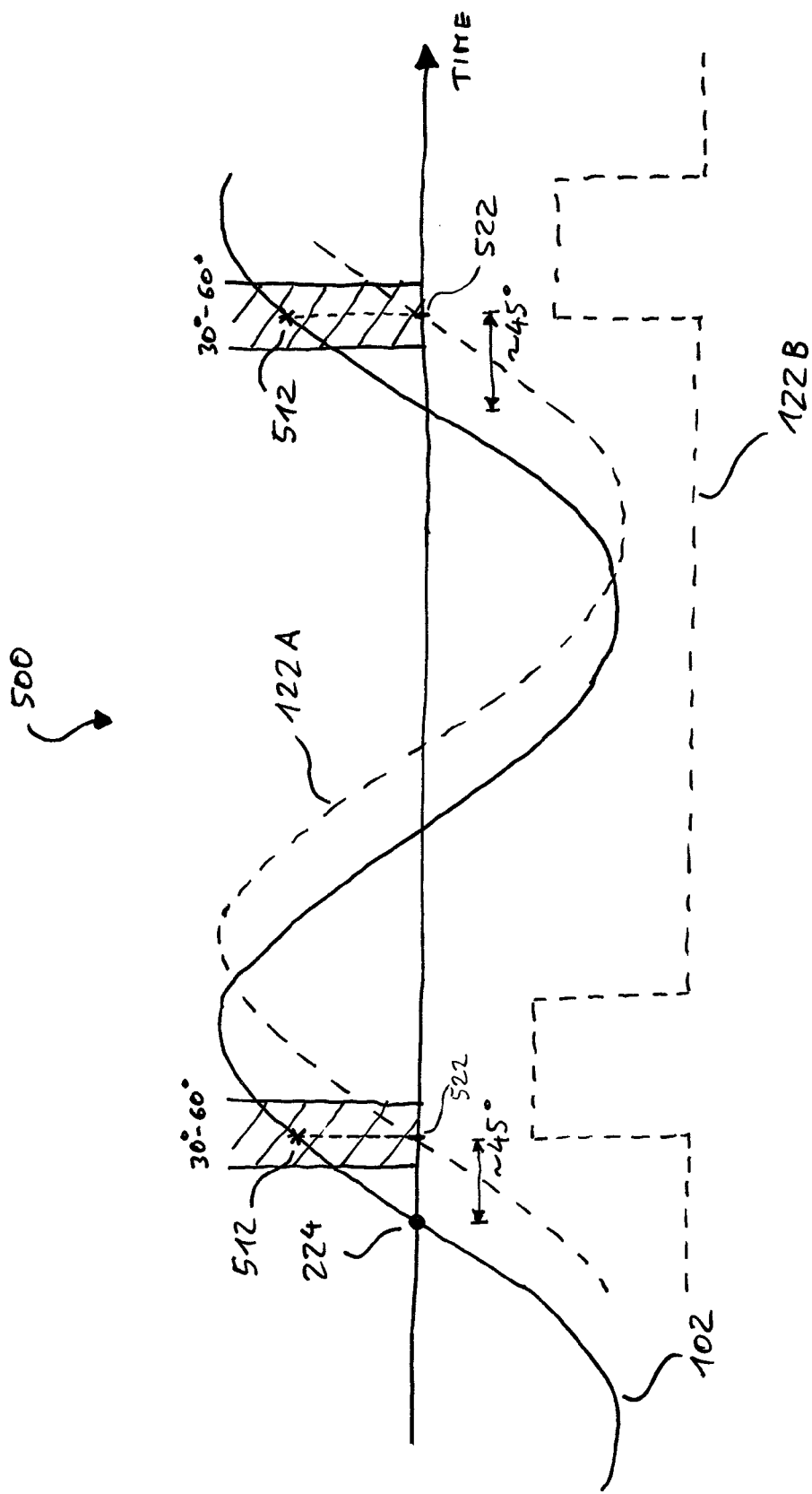
FIG. 5 is a schematic illustration of a carrier signal and two possible trigger signals.

Fittingly, FIG. 5 shows two examples 500 for trigger signals 122a, 122b. For example, if the clock signal 302 is a sine wave signal, the trigger signal 122a may also be a sine wave signal delayed by the predefined phase shift, so that, for example, a zero crossing 522 of the trigger signal 122a may trigger the sampler to sample the carrier signal 102. This is indicated by the dashed line 122a in FIG. 5. Triggering the sampler to sample the carrier signal 102 at the time of the zero crossing 522 of the trigger signal 122a yields a sample point 512 with a phase shift of about 45° in reference to the carrier signal 102. Alternatively, the clock signal 302 may be a digital signal (e.g., square wave signal) and the trigger signal 122b may comprise a rising edge or a falling edge with the predefined phase shift as indicated by the second dashed line 122b. In the shown example, the sampler may be triggered by the rising edge of the trigger signal 122b yielding the sample points 512 with about 45° phase shift.

Alternatively, FIG. 4c shows a trigger unit 120 providing a trigger signal 122 based on a clock signal comprising a frequency equal to an integer multiple of the frequency of the carrier signal $RF_{in}$ (whit tolerances mentioned above).

In one implementation example, the trigger unit 120 may comprise a phase detector and a counter. The phase detector detects the zero crossing or the extreme value of the carrier signal and may provide a reset pulse to the counter. The counter may count periodically a predefined number of count cycles and may be triggered by a clock signal 302 comprising a frequency equal to an integer multiple of the frequency of the carrier signal ($n \times f_c$ with n between 1 and 100 or more) with a tolerance of 1% (or 0.1%, 5%, or 10%) of the frequency of the clock signal. The predefined number of count cycles may be equal to the integer, the frequency of the carrier signal is multiplied with. The counter is reset by the reset pulse to start a new counting period at a reset value between 0 and the predefined number of count cycles depending on the predefined phase shift. The reset value and the predefined number of count cycles may be register values stored in a register. The counter may start a new counting period at a predefined start value, if no reset pulse is received. A counting period starts, for example, at a predefined start/stop value (e.g., 0 or 1) and ends at the predefined number of count cycles or vice versa. Further, the counter may provide the trigger signal with the trigger pulse after reaching the predefined number of count cycles or the start/stop value.

For illustration, a frequency of the clock signal being 16 times larger than the frequency of the carrier signal and a predefined phase shift of 45° may be considered. Then, the counter counts periodically 16 count cycles, for example, from 1 to 16, from 0 to 15, from 15 to 0 or from 16 to 1. Since 45° is $\frac{1}{8}^{th}$ of a full period of the carrier signal, the counter starts, for example, at the reset value of 2 and counts to 0 (start/stop value) before providing a trigger pulse, since the predefined number of count cycles divided by 8 is equal to 2. After this, the counter may periodically count the number of predefined count cycles before providing the next trigger pulse.

FIG. 4d shows another implementation example for a trigger unit 120. The trigger unit 120 comprises a phase detector 410, a calibration unit 420 and a counter 430. The phase detector 410 may be connected to the calibration unit 420 and the calibration unit 420 may be connected to the counter 430. The counter 430 may be connected to the sampler, which is not shown in FIG. 4d. The phase detector 410 may detect a first zero crossing and a second zero crossing or a first extreme value and a second extreme value of the carrier signal 102 and may provide a first reset pulse at the time the first zero crossing or the first extreme value is detected and may provide a second reset pulse at the time the second zero crossing or the second extreme value is detected. For example, the phase detector 410 may detect each zero crossing of a rising edge of the carrier signal. The calibration unit 420 may determine a number of count cycles to be periodically counted by the counter 430 based on the first reset pulse, the second reset pulse and a clock signal. The clock signal may comprise a frequency equal to an integer multiple of the frequency of the carrier signal (with tolerance mentioned above). For example, the calibration unit 420 may count the clock cycles of the clock signal 302 between the first reset pulse and the second reset pulse resulting in the number of count cycles. The determined number of count cycles may be provided to the counter 430 as a reset value. The counter 430 may divide the number of count cycles by the integer, the frequency of the carrier signal is multiplied with, for the first counting period. After counting the divided number of count cycles, the counter 430 may provide a trigger pulse to the sampler. Afterwards, the counter 430 may count periodically the determined number of count cycles before providing a further trigger pulse to the sampler until a new determined number of count cycles is provided by the calibration unit 420.

The frequency of the clock signal 302 may be an integer multiple of a frequency of an internal oscillator providing a time base for the demodulator. The frequency of the oscillator may be equal to the frequency of the carrier signal (with tolerance mentioned above).

Optionally, the calibration unit 420 may be controlled by an enable/disable calibration signal. In this case, the calibration unit 420 determines a number of count cycles only if the enable/disable calibration signal comprising a value representing an enable state of the enable/disable calibration signal. For example, the calibration unit 420 may only receive an enable state of the enable/disable calibration signal, if the carrier signal is unmodulated, since a useful determination of the number of count cycles may only be possible, if the carrier signal is unmodulated (e.g., due to phase modulation of the carrier signal in the modulated state). For this, the trigger unit 120 may comprise a modulation detector for detecting a modulation state of the carrier signal and for providing the enable/disable calibration signal to the calibration unit 420.

Some embodiments according to the invention comprise a down sampler. The down sampler may obtain and provide a down sampled digital signal with a predefined bit rate based on the demodulated signal by selecting sample values from the demodulated signal with a down sampling frequency according to the predefined bit rate. In other words, the down sampler may reduce the amount of data provided by the sampler according to a predefined bit rate. For example, the predefined bit rate may relate to a bit rate of the signal modulated onto the carrier signal or a maximal bit rate of a signal modulated onto the carrier signal.

For example, the modulated carrier signal may comprise a carrier frequency of 13.56 MHz often used by RFID applications. Then, for example, the carrier signal may be sampled by the sampler with a sampling frequency equal to this 13.56 MHz, so that the sampler outputs the modulated signal with the bit rate of 13.56 Mbit/sec. However, the data modulated onto the carrier signal may only comprise a low bit rate, for example, 848 kbit/sec. Therefore, it would be sufficient for the down sampler to select sample values from the demodulated signal with 848 kbit/sec. Alternatively, the sample values may be selected with twice the bit rate or a higher bit rate, for example, for reducing errors. Nevertheless, the amount of sampling data may be reduced by the down sampler. In other words, the predefined bit rate may be equal to a bit rate of a modulation of the carrier signal or an integer multiple of the modulation of the carrier signal.

Figure 6:
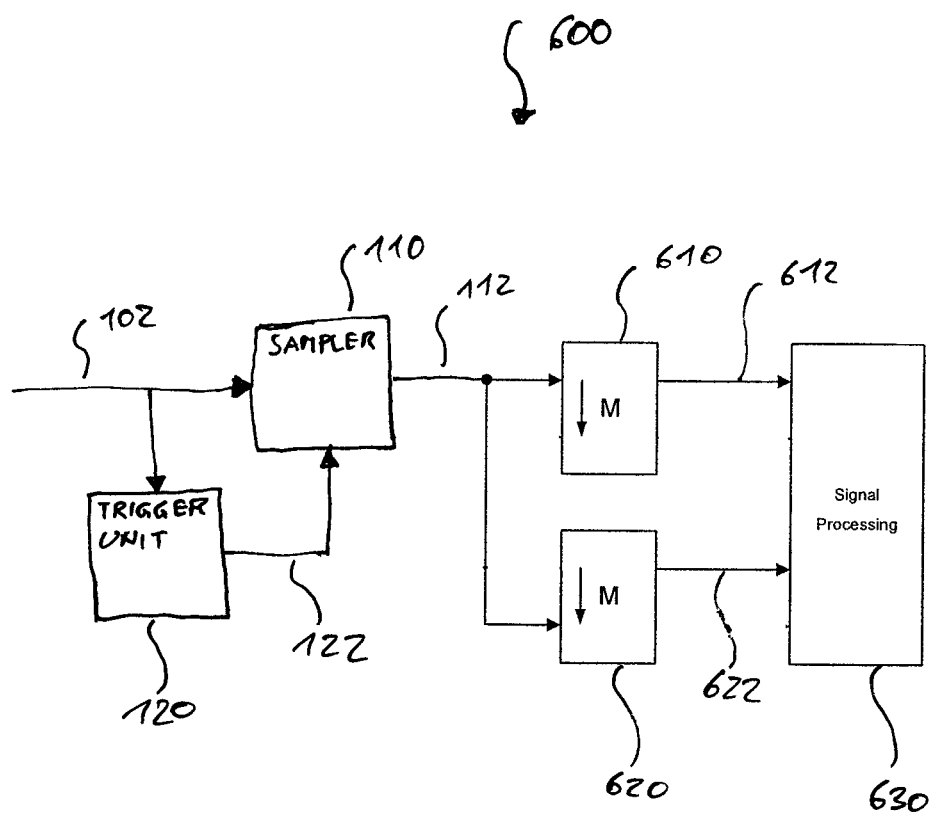
FIG. 6 is a block diagram of yet another embodiment of a demodulator.

Additionally, the demodulator may comprise a second down sampler. FIG. 6 shows a block diagram of a demodulator 600 with two down samplers according to an embodiment of the invention. The second down sampler 620 may obtain and provide a second down sampled signal 622 with the predefined bit rate based on the demodulated signal 112 by selecting sample values from the demodulated signal 112 different from the sample values selected by the first down sampler 610. This may be done with the same down sampling frequency. In other words, the first down sampler 610 and the second down sampler 620 may select sample values from the demodulated signal 112 so that a time a sample value is selected by the first down sampler 610 and a time a sample value is selected by the second down sampler 620 comprise a down sampling time difference. This down sampling time difference of sample values selected by the first down sampler 610 and sample values selected by the second down sampler 620 may depend on the predefined bit rate. For example, the down sampling time difference may be equal to a quarter of the period of the signal modulated onto the modulated carrier signal. In other words, the first down sampled signal 612 of the first down sampler 610 and the second down sampled signal 622 of the second down sampler 620 may comprise a phase shift of, for example, 90° in reference to the signal modulated onto the carrier signal. Alternatively, a phase shift between 0° and 360° may be realized. In this way, it may be guaranteed that one or both down samplers 610, 620 may provide signal with sufficient signal quality. So, the problem of insufficient signal quality of a down sampled signal of a down sampler selecting sample values at a transition of the signal modulated onto the carrier signal from high to low or from low to high (resulting in intermediate values) may be avoided.

A down sampler may be, for example, an independent hardware unit or part of a computer, a digital signal processor or a microcontroller.

Some embodiments according to the invention relate to a demodulator comprising a digital signal processor 630 or a signal processing means as indicated in FIG. 6. The digital signal processor 630 may obtain and provide a digital bitstream based on the demodulated signal provided by the sampler directly. Alternatively, the digital signal processor 630 may obtain and provide the digital bitstream based on the first down sampled signal 612 provided by the first down sampler 610 or the second down sampled signal 622 provided by the second down sampler 620, as shown in FIG. 6.

A digital signal processor 630 may perform an encoding and/or a correction of the data provided by the sampler or the down sampler to obtain the digital bitstream representing the information contained by the signal modulated onto the carrier signal.

The digital signal processor 630 may be an independent hardware unit or a part of a computer or microcontroller or a software product or a computer program product configured to run on a computer or a microcontroller.

Some embodiments according to the invention relate to a demodulator comprising a means for sampling a carrier signal based on a trigger signal to obtain a demodulated signal and a means for detecting a zero crossing of the carrier signal or an extreme value of an amplitude of the carrier signal. Further, the demodulator comprises a means for providing the trigger signal based on the detected zero crossing or the detected extreme value, so that the carrier signal is sampled by the means for sampling the carrier signal with a predefined phase shift to the detected zero crossing or the detected extreme value. The predefined phase shift is larger than 30° plus an integer multiple of 90° and lower than 60° plus the same integer multiple of 90° in reference to the carrier signal.

Some embodiments according to the invention relate to a demodulator comprising an analog-digital-converter (ADC) and a trigger unit. The ADC may sample a carrier signal in a modulated state based on a trigger signal to obtain a demodulated, digital signal. The trigger unit may detect a zero crossing of the carrier signal in an unmodulated state and may provide the trigger signal based on the detected zero crossing, so that the carrier signal is sampled by the ADC with a predefined phase shift of 45° plus an integer multiple of 90° relative to the detected zero crossing in reference to the carrier signal with a tolerance of 5° (or 0.1°, 1° or 10°).

The explanations regarding the trigger unit, the down sampler and others made above are equally applicable to this embodiment.

After detecting the zero crossing, the trigger signal with a trigger pulse considering the predefined phase shift may be provided to the sampler. Afterwards, a trigger pulse may be provided periodically with the frequency of the carrier signal (with tolerances mentioned above). In this way, an unmodulated state of the carrier signal may be used to detect the zero crossing and to consider the predefined phase shift. Then, the carrier signal may be sampled periodically with the frequency of the carrier signal, especially when the carrier signal is in a modulated state.

Some embodiments according to the invention relate to a digital demodulation method for a demodulator for a contactless receiver.

The described concept presents a new demodulation concept, for example, for a contactless proximity reader (PCD). The data transmission from proximity integrated circuit card (PICC) to PCD is called uplink and the term downlink denotes the opposite communication direction. Existing readers may handle data rates up to 848 kbit/sec in both communication directions, which are defined in the standard 14443 Type A/B. Data rates above 848 kbit/sec are called "Very High Data Rates" (VHDR). For this reason, also new modulation methods and coding schemes are designed. The proposed concept introduces a new demodulation scheme, which can handle the modulation methods and coding schemes, which are intended for very high data rates. The proposed receiver architecture, for example, of a PCD is also very versatile concerning different communication standards (i.e. ISO 15693, ISO 14443, ISO 18000-3 Mode 1 and Mode 2).

Data rates above 848 kbit/sec for contactless applications are not standardized. Currently, the maximum data rates are limited to 848 kbit/sec for both communication directions. The data transmission from PICC to PCD is based on a load modulation of the carrier signal. This technique causes basically an amplitude modulation and, additionally, a phase modulation of the received carrier signal. For the demodulation of such a modulated signal, usually an I/Q demodulator is used, which can detect the amplitude and phase information.

Existing contactless receivers have almost an analog fronted with fixed adjusted filter circuits. Therefore, the receiver has no ability to deal with high data rates or/and different modulation methods. An analog I/Q demodulator is used, whereas the received signal is mixed with the carrier signal.

The described concept establishes a demodulator concept of a contactless receiver, which can handle different modulation/coding methods for very high data rates. Already standardized modulation and coding methods can be processed by the proposed demodulator. Today, analog to digital converters are able to operate at high sampling rates. Therefore, the load-modulated carrier signal can be directly converted by an ADC without any analog down conversion.

The described concept may offer several advantages. For example, the hardware concept of the proposed demodulator (especially the analog front end) may be independent of the sub-carrier frequency and the modulation scheme, which offers a great advantage compared to other demodulator concepts. Further, the proposed solution may require no analog filter. In an (known) analog demodulator design, the filter must be adapted to the used sub-carrier frequency. Also, no digital filters may be necessary. A digital filter requires a higher sampling rate, i.e., needs a higher sample rate of the analog to digital converter. Additionally, no need of an analog mixer may be necessary. This task can be done by accordingly ADC sampling. Further, with the adaptive sampling scheme, the demodulator already outputs the baseband modulated sub-carrier.

Some embodiments according to the invention relate to a transceiver comprising a demodulator according to the concept described above and an oscillator unit. The oscillator unit or carrier clock may provide an oscillator signal comprising a carrier frequency. The transceiver may be able to transmit a signal with the carrier frequency based on the oscillator signal and to receive the carrier signal in a modulated state or an unmodulated state.

The transceiver may, for example, be a transceiver of a mobile phone, a contactless proximity reader or another device for wireless communication applications.

Figure 7:
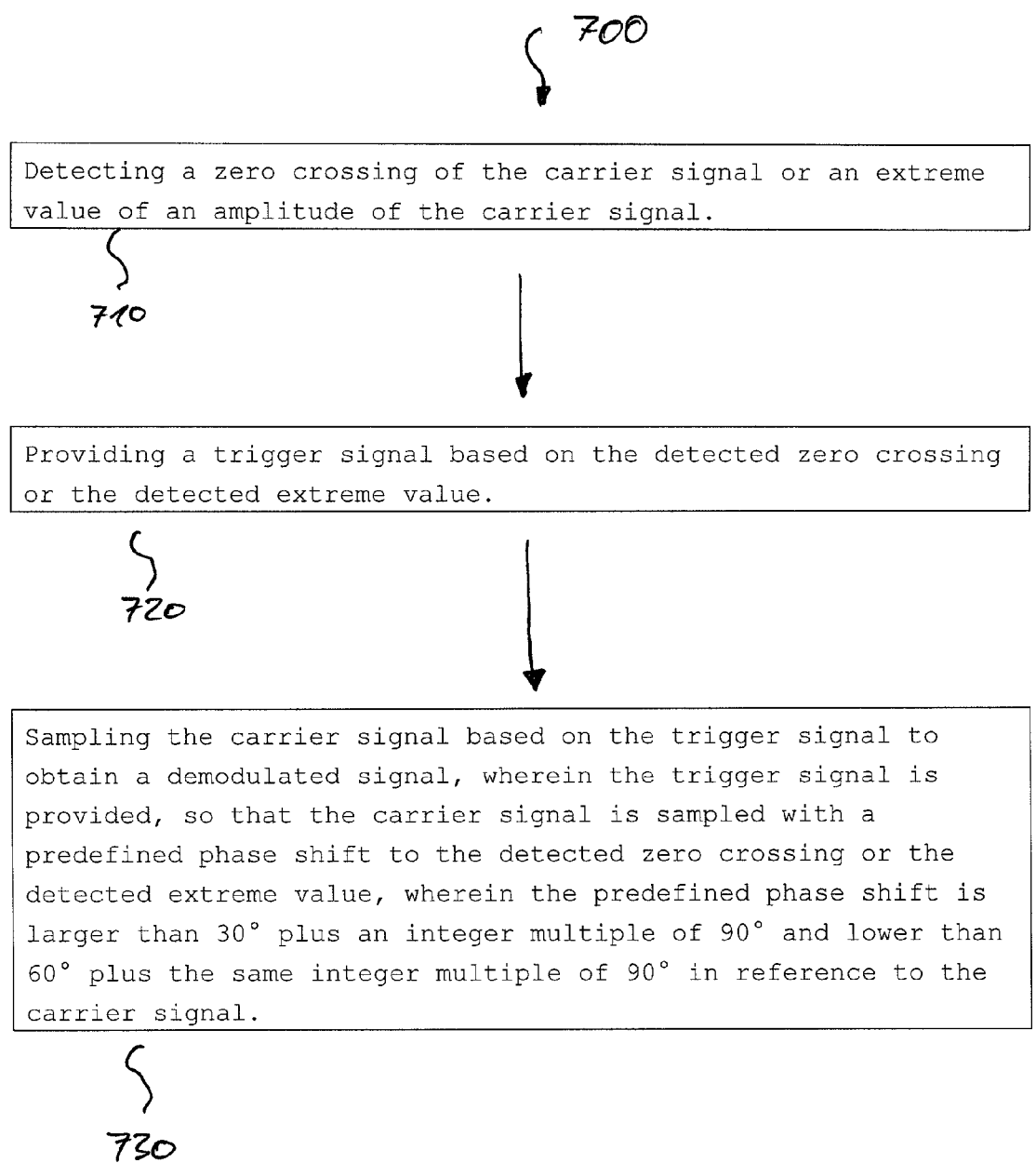
FIG. 7 is a flow chart of a method for demodulating a carrier signal.

FIG. 7 shows a flow chart of a method 700 for demodulating a carrier signal according to an embodiment of the invention. The method 700 comprises detecting a zero crossing of the carrier signal or an extreme value of an amplitude of the carrier signal (Step 710) and providing a trigger signal based on the detected zero crossing or the detected extreme value (Step 720). Further, the method 700 comprises sampling the carrier signal based on the trigger signal to obtain a demodulated signal (Step 730). The trigger signal is provided so that the carrier signal is sampled with a predefined phase shift to the detected zero crossing or the detected extreme value. The predefined phase shift is larger than 30° plus an integer multiple of 90° and lower than 60° plus the same integer multiple of 90° in reference to the carrier signal.

Figure 8:
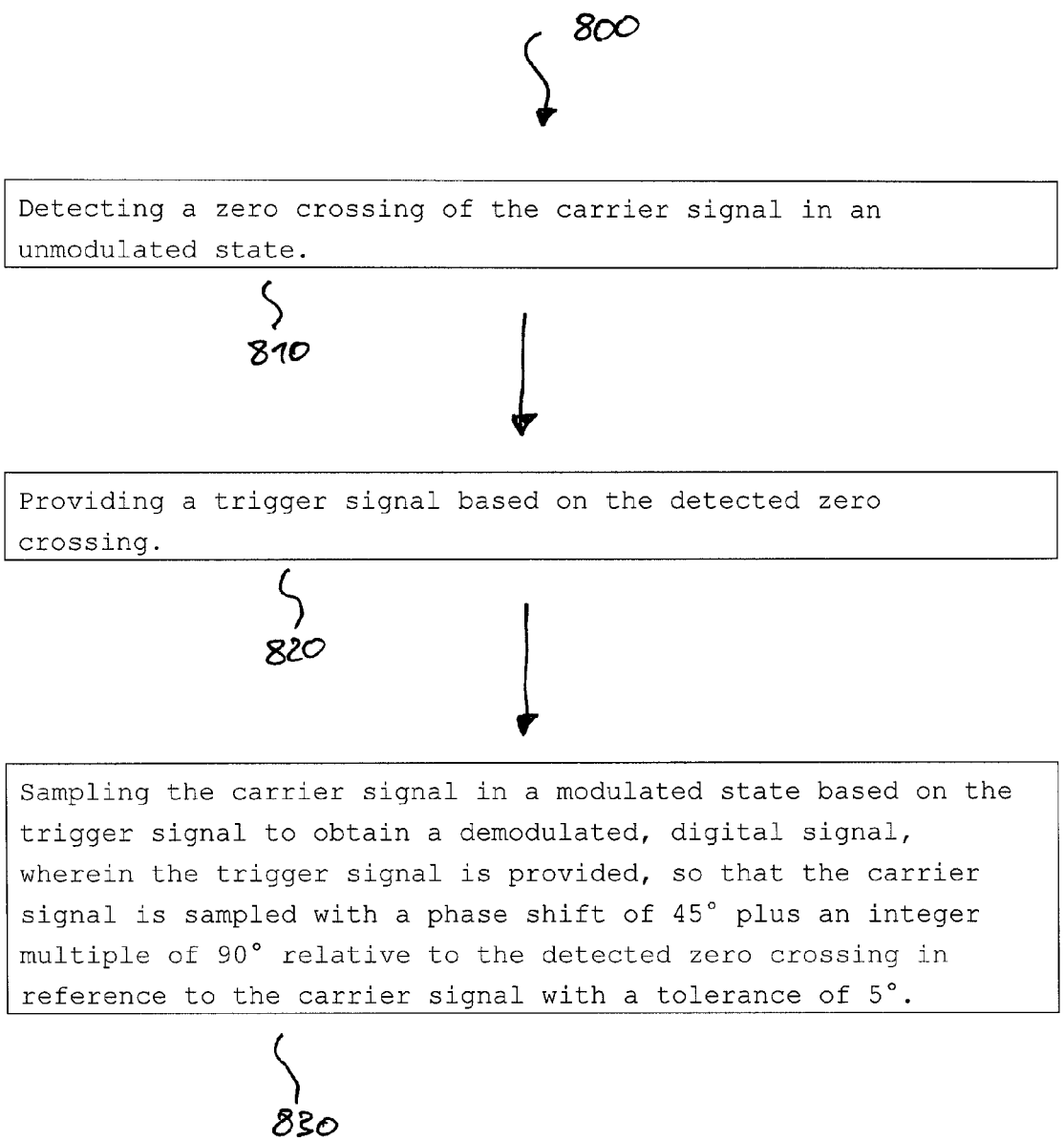
FIG. 8 is a flow chart of a method for demodulating a carrier signal.

FIG. 8 shows a flow chart of a method 800 for demodulating a carrier signal according to another embodiment of the invention. The method 800 comprises detecting a zero crossing of the carrier signal in an unmodulated state (Step 810) and providing a trigger signal based on the detected zero crossing (Step 820). Further, the method 800 comprises sampling the carrier signal in a modulated state based on the trigger signal to obtain a demodulated, digital signal (Step 830). The trigger signal is provided so that the carrier signal is sampled with a predefined phase shift of 45° plus an integer multiple of 90° relative to the detected zero crossing in reference to the carrier signal with a tolerance of 5°.

Embodiments of the invention were described on the basis of a demodulator having a trigger unit for detecting a zero crossing of the carrier signal (0° phase shift) or an extreme value of an amplitude of the carrier signal (90° phase shift) and for providing the trigger signal based on the detected zero crossing or the detected extreme value so that the carrier signal is sampled by the sampler with a predefined phase shift to the detected zero crossing or the detected extreme value, wherein the predefined phase shift is larger than 30° plus an integer multiple of 90° and lower than 60° plus the same integer multiple of 90° in reference to the carrier signal.

However, the invention is not limited to such embodiments. Instead of the zero crossing of the carrier signal or the extreme value of an amplitude of the carrier signal any predefined amplitude value of the carrier signal may be used. In such a case the carrier signal is sampled by the sampler with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal. For example, assume a predefined value for the amplitude of the carrier signal where a phase shift of, e.g., 13° exists. In such a case, the predefined phase shift would be between 17° and 47°. Thereby, the phase shift between the zero crossing of the carrier signal or the extreme value of an amplitude of the carrier signal is again between 30° and 60°.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Although some claims only relate to one other claim, also a combination with further claims may be possible.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A demodulator, comprising:
a sampler configured to sample a carrier signal based on a trigger signal to obtain a demodulated signal; and
a trigger unit configured to detect a predefined amplitude value of the carrier signal and provide the trigger signal based on the detected predefined amplitude value, so that the carrier signal is sampled by the sampler with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal,
wherein the sampler is configured to sample the carrier signal with a sampling frequency equal to a frequency of the carrier signal with a tolerance of 10% of the frequency of the carrier signal.

2. A demodulator according to claim 1, wherein the trigger unit comprises a phase detector and a delay unit, wherein the phase detector is configured to detect the zero crossing or the extreme value of the carrier signal and provide a trigger pulse to the delay unit at the time the zero crossing or the extreme value is detected, wherein the delay unit is configured to delay a clock signal based on the trigger pulse according to the predefined phase shift to obtain the trigger signal represented by the delayed clock signal for the sampler, so that the sampler samples the carrier signal with the predefined phase shift.

3. A demodulator according to claim 2, wherein the clock signal comprises the same frequency as the carrier signal with a tolerance of 1% of the clock signal, so that the sampler is triggered by the trigger signal periodically to sample the carrier signal.

4. A demodulator according to claim 1, wherein the trigger unit comprises a phase detector and a counter, wherein the phase detector is configured to detect the zero crossing or the extreme value of the carrier signal and provide a reset pulse to the counter, wherein the counter is configured to count periodically a predefined number of count cycles and is triggered by a clock signal comprising a frequency equal to an integer multiple of the frequency of the carrier signal with a tolerance of 1% of the frequency of the clock signal, wherein the predefined number of count cycles is equal to the integer, the frequency of the carrier signal is multiplied with, wherein the counter is reset by the reset pulse to start a counting period at a reset value depending on the predefined phase shift, wherein the counter is configured to provide the trigger signal with the trigger pulse after reaching the predefined number of count cycles or a start/stop value.

5. A demodulator according to claim 1, wherein the trigger unit comprises a phase detector, a calibration unit and a counter, wherein the phase detector is configured to detect a first zero crossing and a second zero crossing or a first extreme value and a second extreme value of the carrier signal, provide a first reset pulse at the time the first zero crossing or the first extreme value is detected and provide a second reset pulse at the time the second zero crossing or the second extreme value is detected, wherein the calibration unit is configured to determine a number of count cycles to be periodically counted by the counter based on the first reset pulse, the second reset pulse and a clock signal, wherein the clock signal comprises a frequency equal to an integer multiple of the frequency of the carrier signal with a tolerance of 1% of the frequency of the clock signal, wherein the determined number of count cycles is provided to the counter as a reset value, wherein the counter is configured to divide the number of count cycles by the integer, the frequency of the carrier signal is multiplied with, for a first counting period and after counting the divided number of count cycles, the counter is configured to provide a trigger pulse to the sampler.

6. A demodulator, comprising:
a sampler configured to sample a carrier signal based on a trigger signal to obtain a demodulated signal; and
a trigger unit configured to detect a predefined amplitude value of the carrier signal and provide the trigger signal based on the detected predefined amplitude value, so that the carrier signal is sampled by the sampler with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal,
wherein the trigger unit is configured to detect an unmodulated state of the carrier signal and detect the zero crossing of the carrier signal or the extreme value of the amplitude of the carrier signal based on the unmodulated carrier signal.

7. A demodulator according to claim 6, wherein the predefined amplitude value of the carrier signal is a zero crossing of the carrier signal or an extreme value of an amplitude of the carrier signal, and wherein the predefined phase shift is larger than 30° plus an integer multiple of 90° and lower than 60° plus the same integer multiple of 90° in reference to the carrier signal.

8. A demodulator according to claim 6, wherein the predefined phase shift is equal to 45° plus an integer multiple of 90° in reference to the carrier signal with a tolerance of 5°.

9. A demodulator according to claim 6, wherein the sampler comprises an analog-digital-converter configured to sample the carrier signal based on the trigger signal to obtain a demodulated, digital signal.

10. A demodulator according to claim 9, wherein the analog-digital-converter of the sampler is the only analog-digital-converter of the demodulator for sampling the carrier signal.

11. A demodulator according to claim 6, wherein the trigger unit comprises a phase detector and a delay unit, wherein the phase detector is configured to detect the zero crossing or the extreme value of the carrier signal and provide the trigger signal with a trigger pulse at the time the zero crossing or the extreme value is detected, wherein the delay unit is configured to delay the trigger signal according to the predefined phase shift, so that the sampler is triggered by the delayed trigger pulse to sample the carrier signal with the predefined phase shift.

12. A demodulator according to claim 6, comprising a down sampler configured to provide a down sampled signal with a predefined bit rate by selecting sample values from the demodulated signal with a down sampling frequency according to the predefined bit rate.

13. A demodulator according to claim 12, wherein the predefined bit rate is equal to a bit rate of a modulation of the carrier signal or an integer multiple of the modulation of the carrier signal.

14. A demodulator according to claim 12, comprising a second down sampler configured to provide a second down sampled signal with the predefined bit rate by selecting sample values different from the sample values selected by the first down sampler with the same down sampling frequency.

15. A demodulator according to claim 14, wherein the first down sampler and the second down sampler are configured to select sample values so that a time a sample value is selected by the first down sampler and a time a sample value is selected by the second down sampler comprise a down sampling time difference, wherein the down sampling time difference depends on the predefined bit rate.

16. A demodulator according to claim 6, wherein the demodulator is part of a proximity-coupling device or a contactless proximity reader.

17. A demodulator according to claim 6, wherein the trigger unit comprises a phase detector and a delay unit, wherein the phase detector is configured to detect the zero crossing or the extreme value of the carrier signal and provide a trigger pulse to the delay unit at the time the zero crossing or the extreme value is detected, wherein the delay unit is configured to delay a clock signal based on the trigger pulse according to the predefined phase shift to obtain the trigger signal represented by the delayed clock signal for the sampler, so that the sampler samples the carrier signal with the predefined phase shift.

18. A demodulator according to claim 17, wherein the clock signal comprises the same frequency as the carrier signal with a tolerance of 1% of the clock signal, so that the sampler is triggered by the trigger signal periodically to sample the carrier signal.

19. A demodulator according to claim 6, wherein the trigger unit comprises a phase detector and a counter, wherein the phase detector is configured to detect the zero crossing or the extreme value of the carrier signal and provide a reset pulse to the counter, wherein the counter is configured to count periodically a predefined number of count cycles and is triggered by a clock signal comprising a frequency equal to an integer multiple of the frequency of the carrier signal with a tolerance of 1% of the frequency of the clock signal, wherein the predefined number of count cycles is equal to the integer, the frequency of the carrier signal is multiplied with, wherein the counter is reset by the reset pulse to start a counting period at a reset value depending on the predefined phase shift, wherein the counter is configured to provide the trigger signal with the trigger pulse after reaching the predefined number of count cycles or a start/stop value.

20. A demodulator according to claim 6, wherein the trigger unit comprises a phase detector, a calibration unit and a counter, wherein the phase detector is configured to detect a first zero crossing and a second zero crossing or a first extreme value and a second extreme value of the carrier signal, provide a first reset pulse at the time the first zero crossing or the first extreme value is detected and provide a second reset pulse at the time the second zero crossing or the second extreme value is detected, wherein the calibration unit is configured to determine a number of count cycles to be periodically counted by the counter based on the first reset pulse, the second reset pulse and a clock signal, wherein the clock signal comprises a frequency equal to an integer multiple of the frequency of the carrier signal with a tolerance of 1% of the frequency of the clock signal, wherein the determined number of count cycles is provided to the counter as a reset value, wherein the counter is configured to divide the number of count cycles by the integer, the frequency of the carrier signal is multiplied with, for a first counting period and after counting the divided number of count cycles, the counter is configured to provide a trigger pulse to the sampler.

21. A transceiver comprising:
a demodulator comprising:
a sampler configured to sample a carrier signal based on a trigger signal to obtain a demodulated signal; and
a trigger unit configured to detect a predefined amplitude value of the carrier signal and provide the trigger signal based on the detected predefined amplitude value, so that the carrier signal is sampled by the sampler with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal; and
an oscillator unit configured to provide an oscillator signal comprising a carrier frequency, wherein the transceiver is configured to transmit a signal with the carrier frequency based on the oscillator signal and receive the carrier signal in a modulated state or an unmodulated state,
wherein the trigger unit is configured to detect an unmodulated state of the carrier signal and detect the zero crossing of the carrier signal or the extreme value of the amplitude of the carrier signal based on the unmodulated carrier signal.

22. A demodulator comprising:
an analog-digital-converter configured to sample a carrier signal in a modulated state based on a trigger signal to obtain a demodulated, digital signal; and
a trigger unit configured to detect a zero crossing of the carrier signal in an unmodulated state and provide the trigger signal based on the detected zero crossing, so that the carrier signal is sampled by the analog-digital-converter with a predefined phase shift of 45° plus an integer multiple of 90° relative to the detected zero crossing in reference to the carrier signal with a tolerance of 5°.

23. A demodulator comprising:
means for sampling a carrier signal based on a trigger signal to obtain a demodulated signal;
means for detecting a zero crossing of the carrier signal or an extreme value of an amplitude of the carrier signal; and
means for providing the trigger signal based on the detected zero crossing or the detected extreme value, so that the carrier signal is sampled by the means for sampling with a predefined phase shift to the detected zero crossing or the detected extreme value, wherein the predefined phase shift is larger than 30° plus and integer multiple of 90° and lower than 60° plus the same integer multiple of 90° in reference to the carrier signal,
wherein the means for detecting detects an unmodulated state of the carrier signal and detects the zero crossing of the carrier signal or the extreme value of the amplitude of the carrier signal based on the unmodulated carrier signal.

24. A method for demodulating a carrier signal comprising:
detecting a predefined amplitude value of the carrier signal;
providing a trigger signal based on the detected predefined amplitude value; and
sampling the carrier signal based on the trigger signal to obtain a demodulated signal,
wherein the trigger signal is provided, so that the carrier signal is sampled with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal
wherein detecting the predefined amplitude value of the carrier signal comprises detecting an unmodulated state of the carrier signal and detecting the zero crossing of the carrier signal or the extreme value of the amplitude of the carrier signal based on the unmodulated carrier signal.

25. A method according to claim 24, wherein detecting the predefined amplitude value comprises detecting a zero crossing of the carrier signal or an extreme value of an amplitude of the carrier signal, and wherein the predefined phase shift is larger than 30° plus an integer multiple of 90° and lower than 60° plus the same integer multiple of 90° in reference to the carrier signal.

26. Method for demodulating a carrier signal comprising:
detecting a zero crossing of the carrier signal in an unmodulated state;
providing a trigger signal based on the detected zero crossing; and
sampling the carrier signal in a modulated state based on the trigger signal to obtain a demodulated, digital signal,
wherein the trigger signal is provided, so that the carrier signal is sampled with a phase shift of 45° plus an integer multiple of 90° relative to the detected zero crossing in reference to the carrier signal with a tolerance of 5°.

27. A computer program product comprising a non-transitory computer readable medium storing program code for performing a method of demodulating a carrier signal, when the computer program product runs on a computer or a microcontroller, the method comprising:
detecting a predefined amplitude value of the carrier signal;
providing a trigger signal based on the detected predefined amplitude value; and
sampling the carrier signal based on the trigger signal to obtain a demodulated signal,
wherein the trigger signal is provided, so that the carrier signal is sampled with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal
wherein detecting a predefined amplitude value of the carrier signal comprises detecting an unmodulated state of the carrier signal and detecting the zero crossing of the carrier signal or the extreme value of the amplitude of the carrier signal based on the unmodulated carrier signal.

28. A computer program product comprising a non-transitory computer readable medium storing program code for performing a method of demodulating a carrier signal, when the computer program product runs on a computer or a microcontroller, the method comprising:
- detecting a zero crossing of the carrier signal in an unmodulated state;
- providing a trigger signal based on the detected zero crossing; and
- sampling the carrier signal in a modulated state based on the trigger signal to obtain a demodulated, digital signal, wherein the trigger signal is provided, so that the carrier signal is sampled with a phase shift of 45° plus an integer multiple of 90° relative to the detected zero crossing in reference to the carrier signal with a tolerance of 5°.

29. A transceiver, comprising:
a demodulator comprising:
- a sampler configured to sample a carrier signal based on a trigger signal to obtain a demodulated signal; and
- a trigger unit configured to detect a predefined amplitude value of the carrier signal and provide the trigger signal based on the detected predefined amplitude value, so that the carrier signal is sampled by the sampler with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal; and
- an oscillator unit configured to provide an oscillator signal comprising a carrier frequency, wherein the transceiver is configured to transmit a signal with the carrier frequency based on the oscillator signal and receive the carrier signal in a modulated state or an unmodulated state,
wherein the sampler is configured to sample the carrier signal with a sampling frequency equal to a frequency of the carrier signal with a tolerance of 10% of the frequency of the carrier signal.

30. A demodulator, comprising:
- means for sampling a carrier signal based on a trigger signal to obtain a demodulated signal;
- means for detecting a zero crossing of the carrier signal or an extreme value of an amplitude of the carrier signal; and
- means for providing the trigger signal based on the detected zero crossing or the detected extreme value, so that the carrier signal is sampled by the means for sampling with a predefined phase shift to the detected zero crossing or the detected extreme value, wherein the predefined phase shift is larger than 30° plus and integer multiple of 90° and lower than 60° plus the same integer multiple of 90° in reference to the carrier signal,
wherein the means for sampling samples the carrier signal with a sampling frequency equal to a frequency of the carrier signal with a tolerance of 10% of the frequency of the carrier signal.

31. A method for demodulating a carrier signal, the method comprising:
- detecting a predefined amplitude value of the carrier signal;
- providing a trigger signal based on the detected predefined amplitude value; and
- sampling the carrier signal based on the trigger signal to obtain a demodulated signal,
  wherein the trigger signal is provided, so that the carrier signal is sampled with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal,
  wherein detecting the predefined amplitude value of the carrier signal comprises sampling the carrier signal with a sampling frequency equal to a frequency of the carrier signal with a tolerance of 10% of the frequency of the carrier signal.

32. A computer program product comprising a non-transitory computer readable medium storing program code for performing a method of demodulating a carrier signal, when the computer program product runs on a computer or a microcontroller, the method comprising:
- detecting a predefined amplitude value of the carrier signal;
- providing a trigger signal based on the detected predefined amplitude value; and
- sampling the carrier signal based on the trigger signal to obtain a demodulated signal,
  wherein the trigger signal is provided, so that the carrier signal is sampled with a predefined phase shift, wherein the predefined phase shift is such that a phase shift to a zero crossing of the carrier signal or an extreme value of an amplitude of the carrier signal is larger than 30° plus an integer multiple of 90° and lower than 60° plus the same integer multiple of 90° in reference to the carrier signal,
  wherein detecting the predefined amplitude value of the carrier signal comprises sampling the carrier signal with a sampling frequency equal to a frequency of the carrier signal with a tolerance of 10% of the frequency of the carrier signal.

* * * * *